(12) United States Patent
Niwa

(10) Patent No.: US 6,448,799 B1
(45) Date of Patent: Sep. 10, 2002

(54) TIMING ADJUSTMENT METHOD AND APPARATUS FOR SEMICONDUCTOR IC TESTER

(75) Inventor: Hiromasa Niwa, Honjyo (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 81 days.

(21) Appl. No.: 09/597,108

(22) Filed: Jun. 20, 2000

(30) Foreign Application Priority Data

Sep. 30, 1999 (JP) ............................................ 11-279193

(51) Int. Cl.[7] ............................................ G01R 31/02
(52) U.S. Cl. ...................................... 324/763; 324/765
(58) Field of Search ................................ 324/763, 765, 324/158.1; 714/700, 724, 726, 728, 736, 738

(56) References Cited

U.S. PATENT DOCUMENTS

| | | | | |
|---|---|---|---|---|
| 4,497,056 A | * | 1/1985 | Sugamori | 714/736 |
| 4,928,278 A | * | 5/1990 | Otsuji et al. | 714/700 |
| 5,225,775 A | * | 7/1993 | Sekino | 324/158.1 |
| 5,703,489 A | * | 12/1997 | Kuroe | 324/601 |
| 6,281,698 B1 | * | 8/2001 | Sugimoto et al. | 324/765 |

FOREIGN PATENT DOCUMENTS

| | | | | |
|---|---|---|---|---|
| JP | 4127073 | 4/1992 | | G01R/31/28 |
| JP | 4188086 | 7/1992 | | G01R/31/28 |
| JP | 5075447 | 3/1993 | | H03L/7/00 |

* cited by examiner

*Primary Examiner*—Michael Sherry
*Assistant Examiner*—Minh N. Tang
(74) *Attorney, Agent, or Firm*—Mayer Fortkort & Williams; Karin L. Williams

(57) ABSTRACT

A comparator (30) is connected through switches (13, 14 and 15) with two or more drive-only pins, and the comparator 30 is shared by two or more drive-only pins by changing the switches (13, 14 and 15). The switches are changed one by one and the signal judgment system deskew is carried out on the drive-only pin, which is connected with the comparator. Then, the switches are changed one by one similarly and the signal supply system deskew is carried out using the result of the signal judgment system deskew. Even if the semiconductor IC tester has the drive-only tester pins, the timing adjustment can be performed by carrying out the signal judgment system deskew and the signal supply system deskew.

16 Claims, 2 Drawing Sheets

TIMING ADJUSTMENT METHOD AND APPARATUS FOR SEMICONDUCTOR IC TESTER

FIELD OF THE INVENTION

The present invention relates to a timing adjustment method and apparatus, which adjust the timing of various test signals in semiconductor IC testers.

BACKGROUND OF THE INVENTION

In semiconductor IC testers, a method described in Japanese Patent Laid-Open 1992-127073 is conventionally known for adjusting the timing of signals supplied to drivers and comparators contained in tester pins. FIG. 2 shows the outline of this conventional technology.

With this conventional technology, a special IC (short-circuit chip 2), in which each signal pin is connected to each other, is replaced with a device under test, such as IC memory, and is connected with a semiconductor IC tester (IC tester 3). A control circuit 20 operates a timing generator 11. The timing generator 11 makes all drivers 21–2n, except a driver contained in a tester pin being adjusted, supply their outputs to the short-circuit chip 2. For example, when the tester pin containing the driver 21 is being adjusted, output signals from the drivers 22–2n contained in the tester pins other than the above-noted tester pin are supplied to the short-circuit chip 2. These output signals are compounded at a short-circuit terminal of the short-circuit chip 2 and turn into a single composite waveform. The control circuit 20 increases/decreases the amount of the delay time of a variable delay circuit 61 dedicated comparator based on this composite waveform, and adjusts the timing of the strobe signal supplied to comparators 31 and 41. By changing the tester pin being adjusted one by one, the above-mentioned timing adjustment process is performed on the comparators 31–3n and 41–4n contained in all tester pins.

After finishing this timing adjustment, with the output terminals of the tester pins being open or the short-circuit chip 2 being connected, the control circuit 20 increases/decreases the amount of the delay time of variable delay circuits 51–5n dedicated to driver based on the timing of the comparators 31–3n and 41–4n contained in each tester pin respectively, and adjusts the timing of the signals supplied to the drivers 21–2n.

The above-mentioned timing adjustment to the comparators 31–3n and 41–4n is called a "signal judgment system deskew", and the above-mentioned timing adjustment to the drivers 21–2n is called a "signal supply system deskew". Conventionally, the signal supply system deskew is carried out after carrying out the signal judgment system deskew.

SUMMARY OF THE INVENTION

According to the timing adjustment method in the above-mentioned conventional technology, the signal judgment system deskew and the signal supply system deskew are available only for logic testers whose tester pins comprise the drivers 21–2n, the comparators 31–3n, 41–4n and I/O switches 71–7n that connect the drivers and the comparators, or for completely par pin type testers. Therefore, the above-mentioned timing adjustment is not able to be performed on memory testers having only drive-only tester pins.

The present invention is made in view of the above problem. The purpose of the present invention is to offer a timing adjustment method and apparatus, which can perform timing adjustment by carrying out the signal judgment system deskew and the signal supply system deskew even if a semiconductor IC tester has two or more drive-only tester pins.

According to the present invention, the features of a timing adjustment method for a semiconductor IC tester, which has a plurality of drive-only pins, includes a first step of connecting at least one comparator and an output end of each driver through a switch, one by one, and carrying out the signal judgment system deskew on each drive-only pin. A second step connects the comparator and an output end of each driver through the switches, one by one, and carries out the signal supply system deskew on each drive-only pin according to the result of the signal judgment system deskew.

According to the present invention, the features of a timing adjustment apparatus for a semiconductor IC tester, which has a plurality of drive-only pins, includes a switch connected with an output end of each driver contained in a plurality of drive-only pins, at least one comparator connected in common with the plurality of drivers through the switches, and a control circuit for changing the switches, one by one, and carrying out the signal judgment system deskew on the drive-only pin, which is connected with the comparator, and for changing the switches, one by one, and carrying out the signal supply system deskew on the drive-only pin, which is connected with the comparator, according to the result of the signal judgment system deskew.

In the present invention, the comparator is connected with two or more drive-only pins through the switches, and the comparator is shared by two or more drive-only pins by changing the switches. The switches are changed one by one, and the signal judgment system deskew is carried out on the drive-only pin, which is connected with the comparator. After that, the switches are changed one by one, and the signal supply system deskew is carried out on the drive-only pin, which is connected with the comparator, based on the result of the signal judgment system deskew. Therefore, the timing adjustment by the signal judgment system deskew and the signal supply system deskew can be performed also on the drive-only pins.

DETAILED DESCRIPTION OF PREFERRED EMBODIMENTS

Figure 1:
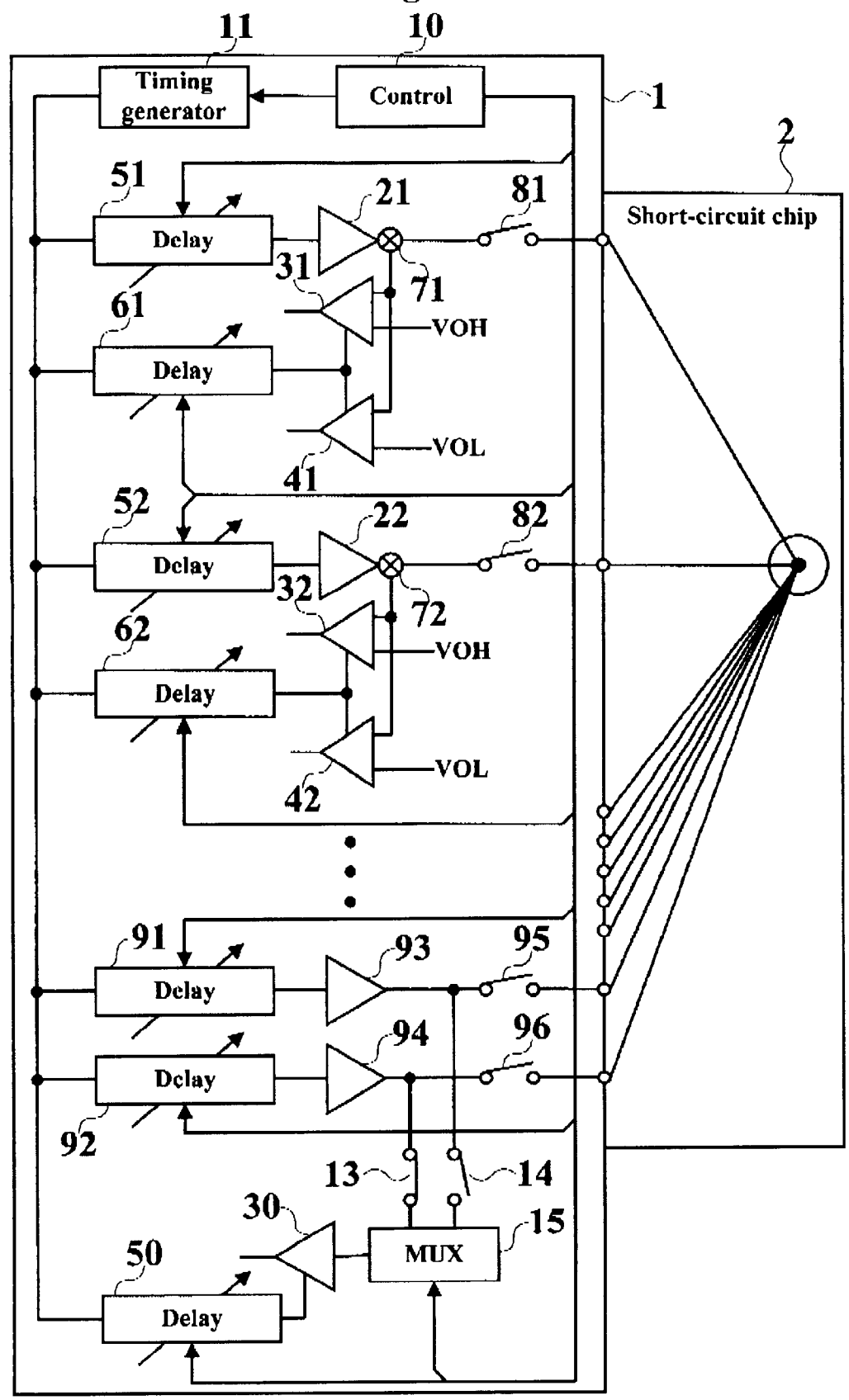
FIG. 1 shows an example of the timing adjustment apparatus for a semiconductor IC tester according to the present invention.
Figure 2:
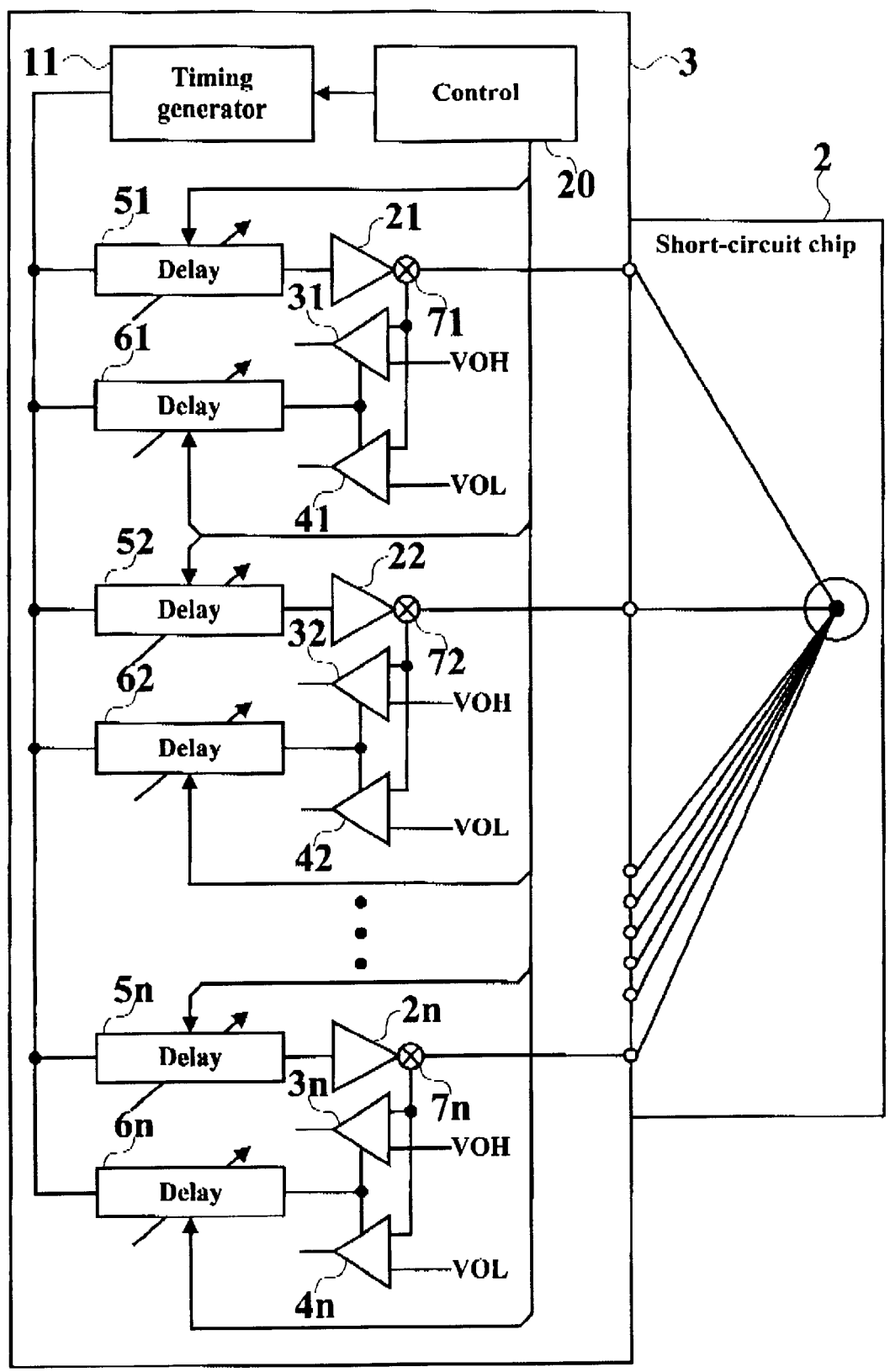
FIG. 2 shows an outline of conventional technology.

Further details are explained below with the help of the example illustrated in the attached drawing. FIG. 1 shows the example of the timing adjustment apparatus for the semiconductor IC tester according to the present invention. In FIG. 1, the same numerals are given to the same elements as those shown in FIG. 2.

A semiconductor IC tester 1 according to this embodiment includes a control circuit 10, a timing generator 11, variable delay circuits 51–5n, 61–6n, 91, 92, 50, drivers 21–2n, 93, 94, comparators 31–3n, 41–4n, 30, I/O switches 71–7n, pin relays 81–8n, 95, 96, switches 13, 14 and a multiplexer 15. Although the actual semiconductor IC tester has many other parts such as a pattern generator, a pin control circuit, a fail bit memory, etc., which are not illustrated in FIG. 1, only the parts required to understand the features of the present invention will be described in this specification.

The control circuit 10 is constructed with microprocessors, and it performs the whole control, operation, management, etc., of the semiconductor IC tester 1. Therefore, although not illustrated in FIG. 1, the control circuit 10 comprises ROMs for storing the system program, RAMs for storing various data, etc. The control circuit 10 outputs various control signals and data to each part if the IC tester.

The timing generator 11 outputs high-speed operation clocks to the pattern generator, the pin control circuit, the fail bit memory, etc., which are not illustrated in FIG. 1, based on the timing data stored in its internal memory, and controls the write-in timing, the read-out timing, etc. of the data to a device under test.

The timing adjustment apparatus of this embodiment adjusts the input timing of the signals, which are output from the timing generator 11, into the drivers 21–2n, the comparators 31–3n, and 41–4n. The short-circuit chip 2 is replaced with a device under test, such as an IC memory, and consists of a special IC in which each signal pin is connected to each other. The signal pins of the short-circuit chip 2 are connected with tester pins of the semiconductor IC tester 1 respectively.

In FIG. 1, the 1st tester pin comprises the driver 21, the comparator 31 dedicated to high-level, the comparator 41 dedicated to low level, the variable delay circuit 51 dedicated to the driver, the variable delay circuit 61 dedicated to the comparator, the I/O switch 71 and the pin relay 81. In the same way, the 2nd-nth tester pins comprise the drivers 22–2n, the comparators 32–3n dedicated to high-level, the comparators 42–4n dedicated to low level, the variable delay circuits 52–5n dedicated to driver, the variable delay circuits 62–6n dedicated to comparator, the I/O switches 72–7n and the pin relays 82–8n. In FIG. 1, illustration of the tester pins from the 3rd to the nth is omitted.

On the other hand, there are drive-only pins, which have no comparator, in this semiconductor IC tester 1. In the example shown in FIG. 1, only two drive-only pins exist. But in practice, it is common that there are many drive-only pins.

The 1st drive-only pin comprises the variable delay circuit 91, the driver 93 and the pin relay 95. The 2nd drive-only pin comprises the variable delay circuit 92, the driver 94 and the pin relay 96.

In the timing adjustment apparatus of this embodiment, the comparator 30 and the variable delay circuit 50 are prepared for the two drive-only pins. By using the switches 13, 14 and the multiplexer 15, output ends of the drivers 93 and 94 contained in each drive-only pin can be alternatively connected with the comparators 30. Since the comparator 30 and the variable delay circuit 50 are shared by two drive-only pins, the signal judgment system deskew can be carried out on each drive-only pin in turn by using the comparator 30 and the variable delay circuit 50. Then the signal supply system deskew on the drivers 93 and 94 contained in the drive-only pins can be carried out based on the result of the signal judgment system deskew.

Operation of the signal judgment system deskew will now be explained. In the state where timing adjustment of the signal supply system is not performed, the timing generator 11 makes all drivers, except the driver that is an object of the signal judgment system deskew, output signals.

When the driver 21 is an object of the signal judgment system deskew, the control circuit 10 turns the switches 13 and 14 off, and controls the drivers 22–2n, 93 and 94, other than the driver 21, so that signal waveforms are output from them. These signal waveforms are compounded at a short-circuit terminal of the short-circuit chip 2 and turn into a single composite waveform. The control circuit 10 increases/decreases the amount of the delay time of the variable delay circuit 61 dedicated to the comparator, adjusts the timing of the strobe signal supplied to the comparators 31 and 41, and carries out the signal judgment system deskew by using this composite waveform as a standard clock.

Next, when the driver 22 is an object of the signal judgment system deskew, the control circuit 10 keeps the switches 13 and 14 off, and controls the drivers 21, 23–2n, 93 and 94, other than the driver 22, so that signal waveforms are output from them. The control circuit 10 increases/decreases the amount of the delay time of the variable delay circuit 62 dedicated to the comparator, adjusts the timing of the strobe signal supplied to the comparators 32 and 42, and carries out the signal judgment system deskew by using a composite waveform of these signal waveforms as a standard clock. The control circuit 10 changes an object of the signal judgment system deskew one by one and carries out the signal judgment system deskew on the drivers 23–2n in the same way.

When the driver 93 is an object of the signal judgment system deskew, the control circuit 10 keeps the switch 13 off and turns the switch 14 on, and controls other drivers 21–2n and 94 so that signal waveforms are output from them. The control circuit 10 increases/decreases the amount of the delay time of the variable delay circuit 50, adjusts the timing of the strobe signal supplied to the comparator 30, and carries out the signal judgment system deskew by using a composite waveform of these signal waveforms as a standard clock. The control circuit 10 stores the result of this signal judgment system deskew on the driver 93 in a memory, which is not illustrated, as a timing adjustment value t93.

Next, when the driver 94 is an object of the signal judgment system deskew, the control circuit 10 turns the switch 13 on and turns the switch 14 off, and controls other drivers 21–2n and 93 so that signal waveforms are output from them. The control circuit 10 increases/decreases the amount of the delay time of the variable delay circuit 50, adjusts the timing of the strobe signal supplied to the comparator 30, and carries out the signal judgment system deskew by using a composite waveform of these signal waveforms as a standard clock. The control circuit 10 stores the result of this signal judgment system deskew on the driver 94 in the memory, which is not illustrated, as a timing adjustment value t94.

The operation of the signal supply system deskew will be now explained. After finishing the above-mentioned signal judgment system deskew, the control circuit 10 carries out the signal supply system deskew using the timing strobe signal adjusted by the signal judgment system deskew as a standard clock. The control circuit 10 opens all pin relays 81–8n, takes each output from the drivers 21–2n into the comparators 31–3n and 41–4n, increases/decreases the amount of the delay times of the variable delay circuits 51–5n dedicated to driver based on each output respectively, and carries out the signal supply system deskew.

Regarding drivers 93 and 94, after carrying out the signal supply system deskew on one of them, the signal supply system deskew is carried out on the other. That is, when the driver 93 is an object of the signal supply system deskew, the control circuit 10 turns the switch 13 off and turns the switch 14 on. The control circuit 10 judges the signal from the driver 93 by using the comparator 30, and adjusts the amount of the delay time of the variable delay circuit 91 based on the judgment result. At this time, the amount of the delay time of the variable delay circuit 50 is set up beforehand according to the above-mentioned timing adjustment value t93.

When the signal supply system deskew on the driver 93 is completed, the control circuit 10 turns the switch 13 on and turns the switch 14 off The control circuit 10 judges the signal from the driver 94 by using the comparator 30, and adjusts the amount of the delay time of the variable delay circuit 92 based on the judgment result. At this time, the amount of the delay time of the variable delay circuit 50 is set up beforehand according to the above-mentioned timing adjustment value t94.

During the above-mentioned signal supply system deskew, it is necessary to add values depending on the course length from the drivers to the device terminals beforehand to timing edges of the variable delay circuits 51–5*n*, 91 and 92, and timing edges of the variable delay circuits 61–6*n* and 50. This is because the course lengths from the drivers to the device terminals are not included since the outputs of the drivers are returned directly to the comparators.

When the above-mentioned signal supply system deskew is completed, the control circuit 10 carries out the signal judgment system deskew again in the same way as described before. This is because leading edges of the composite waveforms compounded at the short-circuit terminal of the short-circuit chip 2 become steep after carrying out the above-mentioned signal judgment system deskew and the above-mentioned signal supply system deskew. The accuracy of the signal supply system deskew can be raised by carrying out the signal judgment system deskew again based on these steep composite waveforms.

Using the timing adjustment method and apparatus according to the present invention, the timing adjustment can be performed by carrying out the signal judgment system deskew and the signal supply system deskew, one after another, even if the semiconductor IC tester has two or more drive-only pins.

What is claimed is:

1. A timing adjustment method for a semiconductor IC tester, which has a plurality of drive-only pins each drive-only pin having driver means but having no comparator means, the method comprising the steps of:

a first step of connecting a comparator means to an output end of the driver means of each of the plurality of drive-only pins, one after another, by selection means, a second step of carrying out a signal judgment system deskew on each of said plurality of drive-only pins each having the driver means connected to the comparator means by the selection means, a third step of connecting the comparator means to the output end of the driver means of each of the plurality of drive-only pins, one after another, by the selection means, a fourth step of carrying out a signal supply system deskew to each of said plurality of drive-only pins each having the driver means connected to the comparator means according to a result of said second step of carrying out the signal judgment system deskew.

2. The timing adjustment method for a semiconductor IC tester according to claim 1, wherein the semiconductor IC tester has n drive-only pins, and the first step and the second step comprising;

a) connecting the output end of a first driver means of a first drive-only pin, which is the object of the signal judgment system deskew, to the comparator means, b) outputting a signal waveform to a short-circuit chip from the driver means of all of the plurality of drive-only pins except the first drive-only pin, c) performing timing adjustment of a strobe signal supplied to the comparator means by increasing or decreasing a first delay amount of a comparator variable delay means on the basis of a single synthetic waveform compounded at a short end of the short-circuit chip, d) storing the first delay amount obtained as a result of the timing adjustment for a memory means as a timing adjustment value of the first drive-only pin, e) connecting the output end of a second driver means of a second drive-only pin, which is the object of the signal judgment system deskew, to the comparator means, f) outputting a signal waveform to the short-circuit chip from the driver means of all of the plurality of drive-only the pins except the second drive-only pin, g) performing timing adjustment of a strobe signal supplied to the comparator means by increasing or decreasing a second delay amount of a comparator variable delay means on the basis of a single synthetic waveform compounded at a short end of the short-circuit chip, and h) storing the second delay amount obtained as a result of the timing adjustment for the memory means as the timing adjustment value of the second drive-only pin, wherein steps (e) through (h) are repeated for a third drive-only pin to n-th drive-only pin.

3. The timing adjustment method for a semiconductor IC tester according to claim 2, the third step and the fourth step comprising;

i) opening the driver means of each of the plurality of drive-only pins by disconnecting the short-circuit chip, j) connecting the output end of the first driver means of the first drive-only pin, which is the object of the signal supply system deskew, to the comparator means, k) outputting a signal waveform from the first driver means of the first drive-only pin to the comparator means, l) performing a timing adjustment of the signal waveform supplied to the comparator means by increasing or decreasing a first driver delay amount of a first driver variable delay means prepared in an input side of the first driver means, m) setting the first driver delay amount obtained as a result of the timing adjust met as a timing adjustment value of the first driver variable delay means, n) connecting the output end of the second driver means of the second drive-only pins, which is the object of the signal supply system deskew, to the comparator means, o) outputting a signal waveform from the second driver means of the second drive-only pin to the comparator means, p) performing the timing adjustment of the signal waveform supplied to the comparator means by increasing or decreasing a second driver delay amount of the second driver variable delay means prepared in an input side of the second driver, and q) setting the second driver delay amount obtained as a result of the timing adjustment as a timing adjustment value of the second driver variable delay means, wherein steps (n) through (q) are repeated for a third drive-only pin to n-th drive-only pin.

4. The timing adjustment method for a semiconductor IC tester according to claim 3, wherein a value corresponding to a course length, from each of the driver means for the plurality of drive-only pins to the input end of the short-circuit chip, is added to the timing adjustment value.

5. The timing adjustment method for a semiconductor IC tester according to claim 1, wherein the signal judgment system deskew is repeated after completion of the signal supply system deskew.

6. The timing adjustment method for a semiconductor IC tester according to claim 2, wherein the signal judgment system deskew is repeated after completion of the signal supply system deskew.

7. The timing adjustment method for a semiconductor IC tester according to claim 3, wherein the signal judgment system deskew is repeated after completion of the signal supply system deskew.

8. The timing adjustment method for a semiconductor IC tester according to claim 4, wherein the signal judgment system deskew is repeated after completion of the signal supply system deskew.

9. A timing adjust apparatus for a semiconductor IC tester, which has a plurality of drive-only pins each drive-only pin having driver means but having no comparator means, the apparatus comprising:

a short-circuit chip having a plurality of signal pins, each signal pin having a first end and a second end, the first end of each signal pin connected with a driver means of the semiconductor IC tester, and the second end of each signal pin shorted to each other;

selection means for selecting an output end of each driver means of the plurality of drive-only pins, at least one comparator means selectively connected to the driver means of the plurality of drive-only pins through said selection means, control means for carrying out a signal judgment system deskew to the drive-only pins connected to said at least one comparator means by said selection means, and carrying out a signal supply system deskew to the drive-only pins connected to said at least one comparator means by the selection means using a result of the signal judgment deskew.

10. The timing adjustment apparatus for a semiconductor IC tester according to claim 9, wherein the semiconductor IC tester has n drive-only pins, and wherein the control means:

a) connects an output end of a first driver means of a first drive-only pin which is a object of the signal judgment system deskew to said at least one comparator means, b) outputs a first signal waveform to said short-circuit chip from the driver means of all of the plurality of drive-only pins except the first drive-only pin, c) performs a timing adjustment of a strobe signal supplied to said at least one comparator means by increasing or decreasing a first delay amount of a comparator variable delay means on the basis of a single synthetic waveform compounded at a short end of said short-circuit chip, d) stores the first delay amount obtained as a result of the timing adjustment for a memory means as a timing adjustment value of the first drive-only pin, e) connects a output end of a second driver means of a second drive-only pin which is the object of the signal judgment system deskew to said at least one comparator means, f) outputs a second signal waveform to said short-circuit chip from the driver means of all of the drive-only pins except the second drive-only pin, g) performs a timing adjustment of the strobe signal supplied to said at least one comparator means by increasing or decreasing a second delay amount of a comparator variable delay means on the basis of a single synthetic waveform compounded at the short end of said short-circuit chip, and h) stores the second delay amount obtained as a result of the timing adjustment for a memory means as a timing adjustment value of the second drive-only pin, wherein steps (e) through (h) are repeated for a third drive-only pin to n-th drive-only pin.

11. The timing adjustment apparatus for a semiconductor IC tester according to claim 10, wherein the control means:

i) opens the driver means of each of the plurality of drive-only pins by disconnecting said short-circuit chip, j) connects the output end of the first driver means of the first drive-only pin which is the object of the signal supply system deskew to said at least one comparator means, k) outputs a signal waveform from the first driver means of the first drive-only pin to said at least one comparator means, l) performs a timing adjustment of the signal waveform supplied to said at least one comparator means by increasing or decreasing a first driver delay amount of a first drive variable delay means prepared in an input side of the first driver means, m) set a first driver delay amount obtained as a result of the timing adjustment as a timing adjustment value of the first driver variable delay means, n) connects the output end of the second first driver means of the second drive-only pin which is the object of the signal supply system deskew to said at least one comparator means, o) outputs a signal waveform from the second first driver means of the second drive-only pin to said at least one comparator means, p) performs a timing adjustment of the signal waveform supplied to said at lead one comparator means by increasing or decreasing a second driver delay amount of a second drive variable delay means prepared in an input side of the second driver means, and q) sets the second driver delay amount obtained as a result of the timing adjustment as a timing adjustment value of the second driver variable delay means, wherein steps (n) through (q) are repeated for a third drive-only pin to n-th drive-only pin.

12. The timing adjustment method for a semiconductor IC tester according to claim 11, wherein a value corresponding to a course length from each of the driver means for the plurality of drive-only pins to the input end of said short-circuit chip is added to the timing adjustment value.

13. The timing adjustment apparatus for a semiconductor IC tester according to claim 9, wherein the signal judgment system deskew is repeated, after completion of the signal supply system deskew, by said control means.

14. The timing adjustment apparatus for a semiconductor IC tester according to claim 10, wherein the signal judgment system deskew is repeated, after completion of the signal supply system deskew, by said control means.

15. The timing adjustment apparatus for a semiconductor IC tester according to claim 11, wherein the signal judgment system deskew is repeated, after completion of the signal supply system deskew, by said control means.

16. The timing adjustment apparatus for a semiconductor IC tester according to claim 12, wherein the signal judgment system deskew is repeated, after completion of the signal supply system deskew, by said control means.

* * * * *